(12) United States Patent
Yen et al.

(10) Patent No.: US 10,134,684 B2
(45) Date of Patent: Nov. 20, 2018

(54) PATTERNED SHIELD STRUCTURE

(71) Applicant: Realtek Semiconductor Corporation, Hsinchu (TW)

(72) Inventors: Hsiao-Tsung Yen, Hsinchu (TW); Cheng-Wei Luo, Hsinchu (TW); Yuh-Sheng Jean, Hsinchu County (TW); Ta-Hsun Yeh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/623,370

(22) Filed: Jun. 14, 2017

(65) Prior Publication Data
US 2017/0365560 A1 Dec. 21, 2017

(30) Foreign Application Priority Data
Jun. 17, 2016 (TW) .............................. 105119153 A (51) Int. Cl.
*H01L 27/08* (2006.01)
*H01L 23/552* (2006.01)
*H01L 49/02* (2006.01)

(52) U.S. Cl.
CPC ............ *H01L 23/552* (2013.01); *H01L 28/10* (2013.01)

(58) Field of Classification Search
None
See application file for complete search history.

(56) References Cited

U.S. PATENT DOCUMENTS

| 2011/0076979 | A1* | 3/2011 | Wu ................... H01F 17/0006 455/318 |
| 2016/0315136 | A1* | 10/2016 | Yen ........................ H01L 28/10 |
| 2017/0076857 | A1 | 3/2017 | Huang et al. | |

OTHER PUBLICATIONS

Hsiao-Tsung Yen et al., "Patterned Ground Shield", U.S. Appl. No. 15/233,967, filed Aug. 11, 2016.

* cited by examiner

*Primary Examiner* — Calvin Choi
(74) *Attorney, Agent, or Firm* — CKC & Partners Co., Ltd.

(57) ABSTRACT

A patterned shield structure applied to an integrated circuit (IC) is disposed between an inductor and a substrate of the integrated circuit. The patterned shield structure includes a center structure unit, a first patterned structure unit, and a second patterned structure unit. The center structure unit includes a first sub-center structure unit and a second sub-center structure unit. The second sub-center structure unit and the first sub-center structure unit are symmetrically disposed with respect to a middle of the center structure unit. The first patterned structure unit is disposed on one side of the center structure unit. The second patterned structure unit is disposed on another side of the center structure unit. The second patterned structure unit and the first patterned structure unit are symmetrically disposed with respect to the center structure unit.

9 Claims, 6 Drawing Sheets

PATTERNED SHIELD STRUCTURE

RELATED APPLICATIONS

This application claims priority to Taiwan Application Serial Number 105119153, filed Jun. 17, 2016, which is herein incorporated by reference.

BACKGROUND

Field of Invention

The present disclosure relates to an integrated circuit. More particularly, the present disclosure relates to a patterned shield structure applied to an inductor in an integrated circuit.

Description of Related Art

With the progress of technology, the process of the integrated circuit has marched towards 28 nanometers (nm) and 20 nanometers. In such a miniaturized size, many negative impacts emerge. For example, because the oxide layer in the integrated circuit has a smaller thickness, the capacitance value is thus higher. In addition, the thinner oxide layer will generate eddy currents on the substrate. All the situations affect the quality factor of the inductor.

For the forgoing reasons, there is a need to solve the above-mentioned problems by providing a patterned shield structure, which is also an objective that the industry is eager to achieve.

SUMMARY

A patterned shield structure is provided. The patterned shield structure is applied to an integrated circuit. The patterned shield structure is disposed between an inductor and a substrate of the integrated circuit. The patterned shield structure comprises a center structure unit, a first patterned structure unit, and a second patterned structure unit. The center structure unit comprises a first sub-center structure unit and a second sub-center structure unit. The second sub-center structure unit and the first sub-center structure unit are symmetrically disposed with respect to a middle of the center structure unit. The first patterned structure unit is disposed on one side of the center structure unit. The second patterned structure unit is disposed on another side of the center structure unit, and the second patterned structure unit and the first patterned structure unit are symmetrically disposed with respect to the center structure unit.

Therefore, the present disclosure provides the patterned shield structure, which can be applied to the integrated circuit, so as to improve on the problem that the quality factor of the inductor is decreased.

DESCRIPTION OF THE EMBODIMENTS

Figure 1:
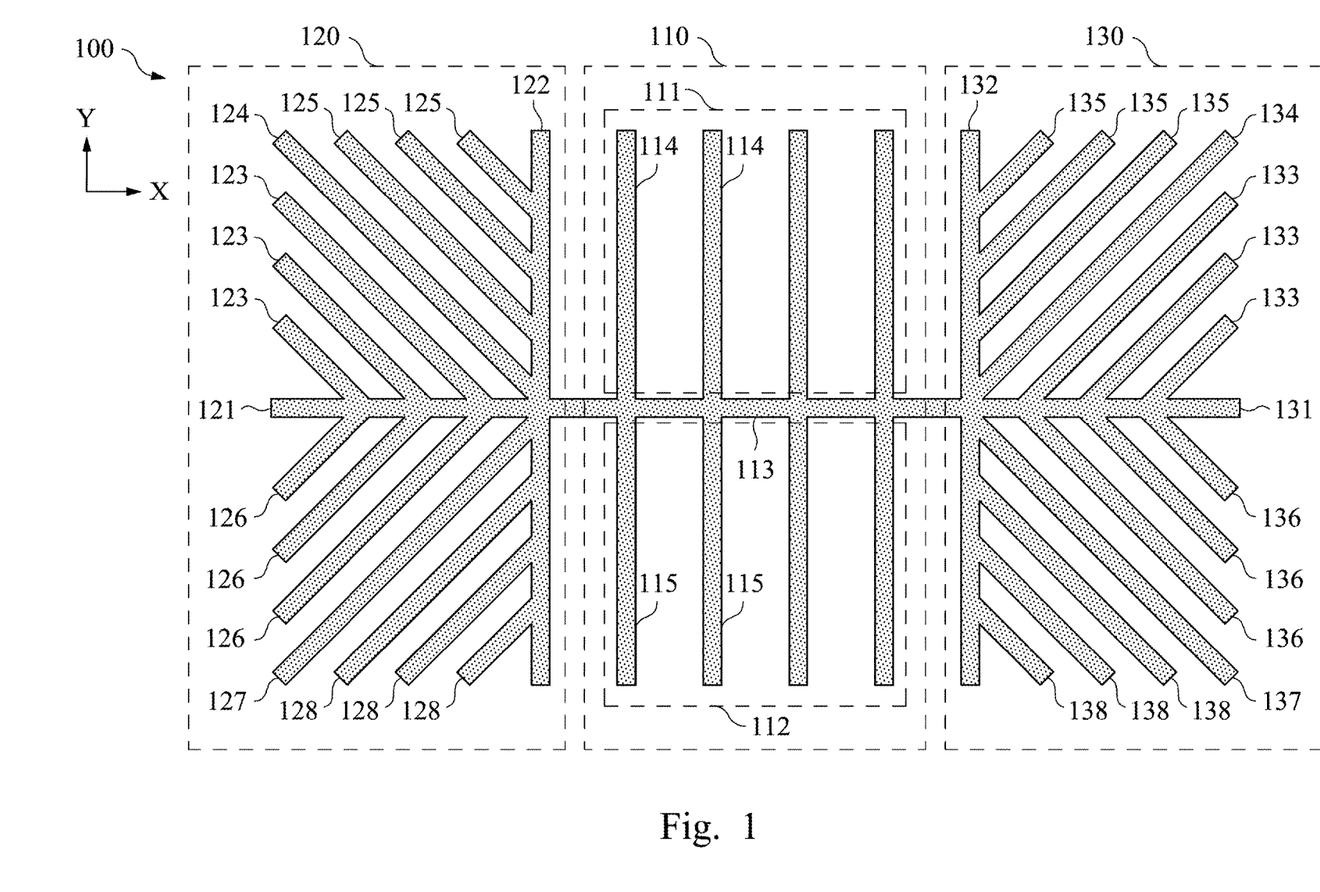
FIG. 1 depicts a schematic diagram of a patterned shield structure according to some embodiments of this disclosure.

FIG. 1 depicts a schematic diagram of a patterned shield structure 100 according to one embodiment of this disclosure. As shown in FIG. 1, the patterned shield structure 100 is applied to an integrated circuit (not shown in the figure). As for the structure, the patterned shield structure 100 is disposed between an inductor and a substrate of the integrated circuit. In one embodiment, the patterned ground shield (PGS) structure 100 may be coupled to a ground terminal, and its function is described as follows. When the inductor of the integrated circuit operates, eddy currents are generated on the substrate. If a patterned ground shield is disposed between the inductor and the substrate of the integrated circuit, the patterned ground shield can serve as a shield to avoid that the eddy currents are generated on the substrate when the inductor operates. As a result, the quality factor of the inductor is improved.

A description is provided with reference to FIG. 1. The patterned shield structure 100 comprises a center structure unit 110, a first patterned structure unit 120, and a second patterned structure unit 130. The center structure unit 110 comprises a first sub-center structure unit 111 and a second sub-center structure unit 112. The second sub-center structure unit 112 and the first sub-center structure unit 111 are symmetrically disposed with respect to a middle of the center structure unit 110 (such as a portion of the center structure unit numbered as 113). The first patterned structure unit 120 is disposed on one side (such as on a left side in the figure) of the center structure unit 110. The second patterned structure unit 130 is disposed on another side (such as on a right side in the figure) of the center structure unit 110. In addition, the second patterned structure unit 130 and the first patterned structure unit 120 are symmetrically disposed with respect to the center structure unit 110.

In one embodiment, the center structure unit 110 further comprises a first backbone 113. The first backbone 113 is disposed in the middle of the center structure unit 110. Additionally, the first sub-center structure unit 111 of the center structure unit 110 comprises a plurality of first branches 114. One end of each of the first branches 114 is coupled to one side (such as an upper side) of the first backbone 113, and the first branches 114 extend outwardly in a direction away from the first backbone 113. In addition, the second sub-center structure unit 112 comprises a plurality of second branches 115. One end of each of the second branches 115 is coupled to another side (such as a lower side) of the first backbone 113, and the second branches 115 extend outwardly in a direction away from the first backbone 113.

In another embodiment, each of the first patterned structure unit 120 and the second patterned structure unit 130 comprises a fishbone structure. For example, the first patterned structure unit 120 comprises a second backbone 121, a third backbone 122, a plurality of third branches 123-125, and a plurality of fourth branches 126-128. The second backbone 121 is disposed in a first direction (such as X direction) and is located in a middle of the first patterned structure unit 120. The third backbone 122 is disposed in a second direction (such as Y direction) approximately perpendicular to the first direction, and is located on one side (such as a right side) of the first patterned structure unit 120. A connection point of the second backbone 121 and the third backbone 122 is coupled to the first backbone 113 of the center structure unit 110. One end of each of part of the third branches 123 is coupled to one side (such as an upper side) of the second backbone 121 and the part of the third branches 123 extend outwardly in a direction away from the second backbone 121, and an angle between the third branches 123 and the second backbone 121 is an acute angle. One end of each of part of the fourth branches 126 is coupled to another side (such as a lower side) of the second backbone 121 and the part of the fourth branches 126 extend outwardly in a direction away from the second backbone 121, and an angle between the fourth branches 126 and the second backbone 121 is an acute angle. In one embodiment, the angle between the third branches 123 and the second backbone 121 and the angle between the fourth branches 126 and the second backbone 121 are between about 30 degrees and about 60 degrees.

In still another embodiment, one end of each of part of the third branches 125 is coupled to the third backbone 122 and the part of the third branches 125 extend outwardly in a direction away from the third backbone 122, and an angle between the third branches 125 and the third backbone 122 is an acute angle. Additionally, one end of each of part of the fourth branches 128 is coupled to the third backbone 122 and the part of the fourth branches 128 extend outwardly in a direction away from the third backbone 122, and an angle between the fourth branches 128 and the third backbone 122 is an acute angle. In one embodiment, the angle between the third branches 125 and the third backbone 122 and the angle between the fourth branches 128 and the third backbone 122 are between about 30 degrees and about 60 degrees. In another embodiment, the second backbone 121 and the third backbone 122 are coupled to the connection point. One of the third branches (such as the third branch 124) and one of the fourth branches (such as the fourth branch 127) are coupled to the above connection point.

In another embodiment, for example, the second patterned structure unit 130 comprises a fourth backbone 131, a fifth backbone 132, a plurality of fifth branches 133-135, and a plurality of sixth branches 136-138. The fourth backbone 131 is disposed in the first direction (such as X direction) and is located in a middle of the second patterned structure unit 130. The fifth backbone 132 is disposed in the second direction (such as Y direction) approximately perpendicular to the first direction, and is located on one side (such as a left side) of the second patterned structure unit 130. A connection point of the fourth backbone 131 and the fifth backbone 132 is coupled to the first backbone 113 of the center structure unit 110. One end of each of part of the fifth branches 133 is coupled to one side (such as an upper side) of the fourth backbone 131 and the part of the fifth branches 133 extend outwardly in a direction away from the fourth backbone 131, and an angle between the fifth branches 133 and the fourth backbone 131 is an acute angle. One end of each of part of the sixth branches 136 is coupled to another side (such as a lower side) of the fourth backbone 131 and the part of the sixth branches 136 extend outwardly in a direction away from the fourth backbone 131, and an angle between the sixth branches 136 and the fourth backbone 131 is an acute angle. In one embodiment, the angle between the fifth branches 133 and the fourth backbone 131 and the angle between the sixth branches 136 and the fourth backbone 131 are between about 30 degrees and about 60 degrees.

In still another embodiment, one end of each of part of the fifth branches 135 is coupled to the fifth backbone 132 and the part of the fifth branches 135 extend outwardly in a direction away from the fifth backbone 132, and an angle between the fifth branches 135 and the fifth backbone 132 is an acute angle. Additionally, one end of each of part of the sixth branches 138 is coupled to the fifth backbone 132 and the part of the sixth branches 138 extend outwardly in a direction away from the fifth backbone 132, and an angle between the sixth branches 138 and the fifth backbone 132 is an acute angle. In one embodiment, the angle between the fifth branches 135 and the fifth backbone 132 and the angle between the sixth branches 138 and the fifth backbone 132 are between about 30 degrees and about 60 degrees. In yet another embodiment, the fourth backbone 131 and the fifth backbone 132 are coupled to the connection point. One of the fifth branches (such as the fifth branch 134) and one of the sixth branches (such as the sixth branch 137) are coupled to the above connection point.

Figure 2:
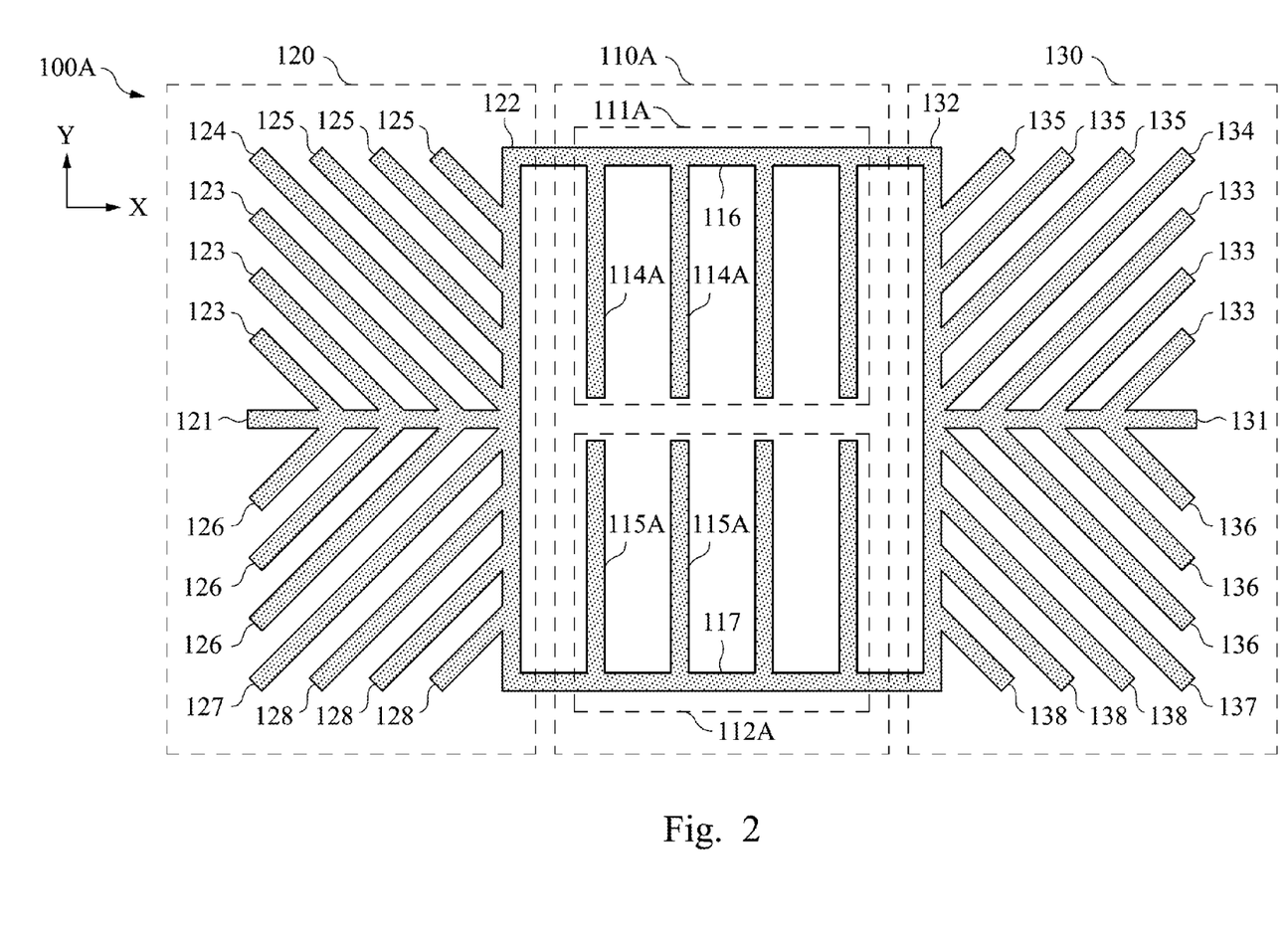
FIG. 2 depicts a schematic diagram of a patterned shield structure according to some embodiments of this disclosure.

FIG. 2 depicts a schematic diagram of a patterned shield structure 100A according to some embodiments of this disclosure. As compared with the center structure unit 110 shown in FIG. 1, a center structure unit 110A in this embodiment is different. A description is provided as follows. A first sub-center structure unit 111A of the center structure unit 110A comprises a plurality of first strip portions 114A and a second strip portion 116. The first strip portions 114A are disposed in a first direction (such as Y direction). The second strip portion 116 is disposed in a second direction (such as X direction) approximately perpendicular to the first direction, and the second strip portion 116 is coupled to one end (such as an upper end) of each of the first strip portions 114A. In one embodiment, another end (such as a lower end) of each of the first strip portions 114A is not coupled to any other element.

In addition, a second sub-center structure unit 112A comprises a plurality of third strip portions 115A and a fourth strip portion 117. The third strip portions 115A are disposed in the first direction (such as Y direction). The fourth strip portion 117 is disposed in the second direction (such as X direction) approximately perpendicular to the first direction, and the fourth strip portion 117 is coupled to one end (such as a lower end) of each of the third strip portions 115A. In one embodiment, another end (such as an upper end) of each of the third strip portions 115A is not coupled to any other element. In addition to that, since the patterned structure units 120, 130 in the patterned shield structure 100A shown in FIG. 2 are similar to the patterned structure units 120, 130 in the patterned shield structure 100 shown in FIG. 1, a description in this regard is not provided for simply matters.

Figure 3:
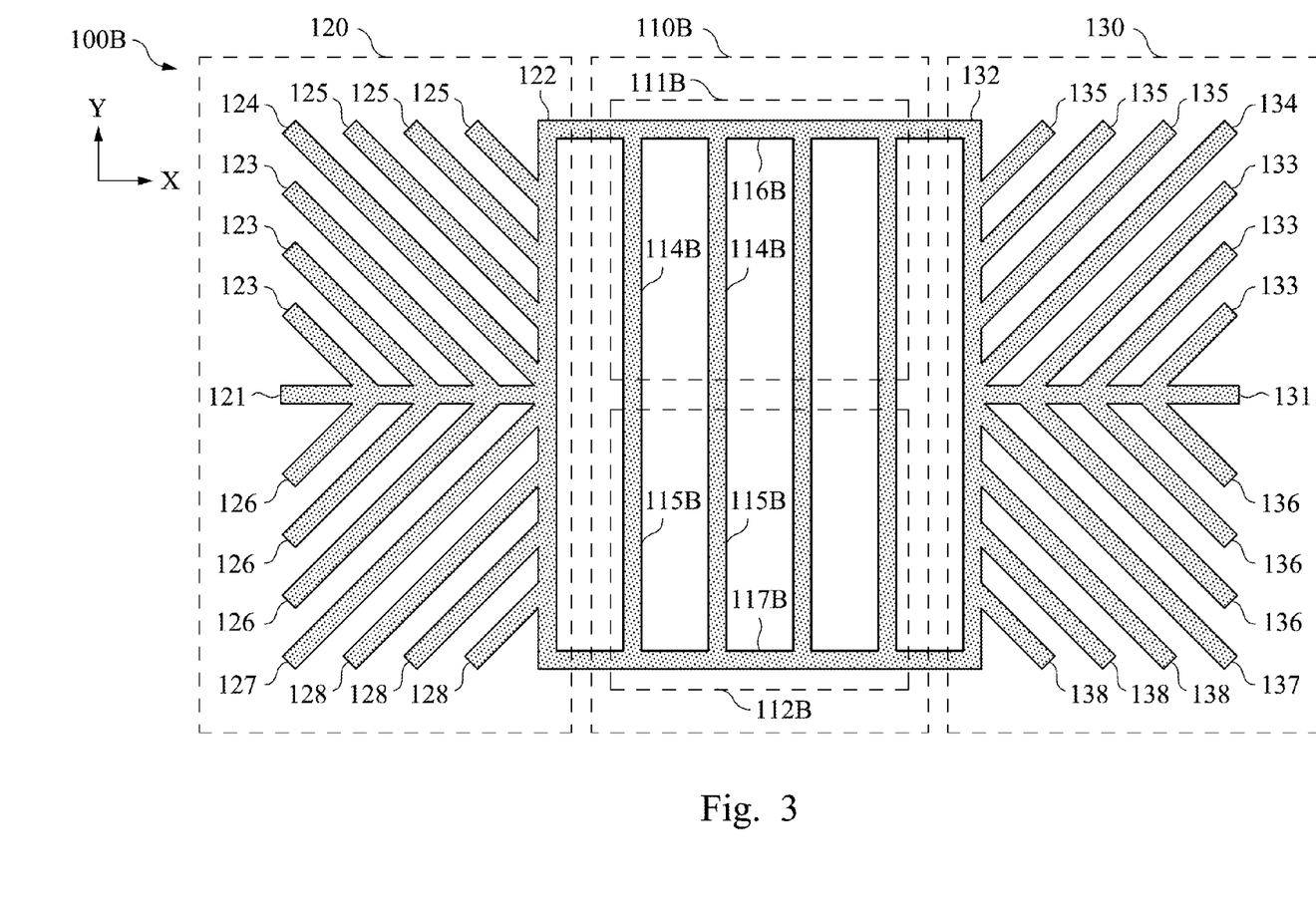
FIG. 3 depicts a schematic diagram of a patterned shield structure according to some embodiments of this disclosure.

FIG. 3 depicts a schematic diagram of a patterned shield structure 100B according to some embodiments of this disclosure. As compared with the center structure unit 110A shown in FIG. 2, a center structure unit 110B in this embodiment is different. A description is provided as follows. In the present embodiment, each of a plurality of first strip portions 114B is coupled to one of a plurality of third strip portions 115B correspondingly. To put it another way, the center structure unit 110B in FIG. 3 is disposed as a grate structure that comprises a second strip portion 116B and a fourth strip portion 117B respectively disposed at an upper end and a lower end. An integral column portion formed by the first strip portions 114B and the third strip portions 115B is coupled between the second strip portion 116B and the fourth strip portion 117B. It is noted that since the patterned structure units 120, 130 in the patterned shield structure 100B shown in FIG. 3 are similar to the patterned structure units 120, 130 in the patterned shield structure 100 shown in FIG. 1, a description in this regard is not provided for simply matters.

Figure 4:
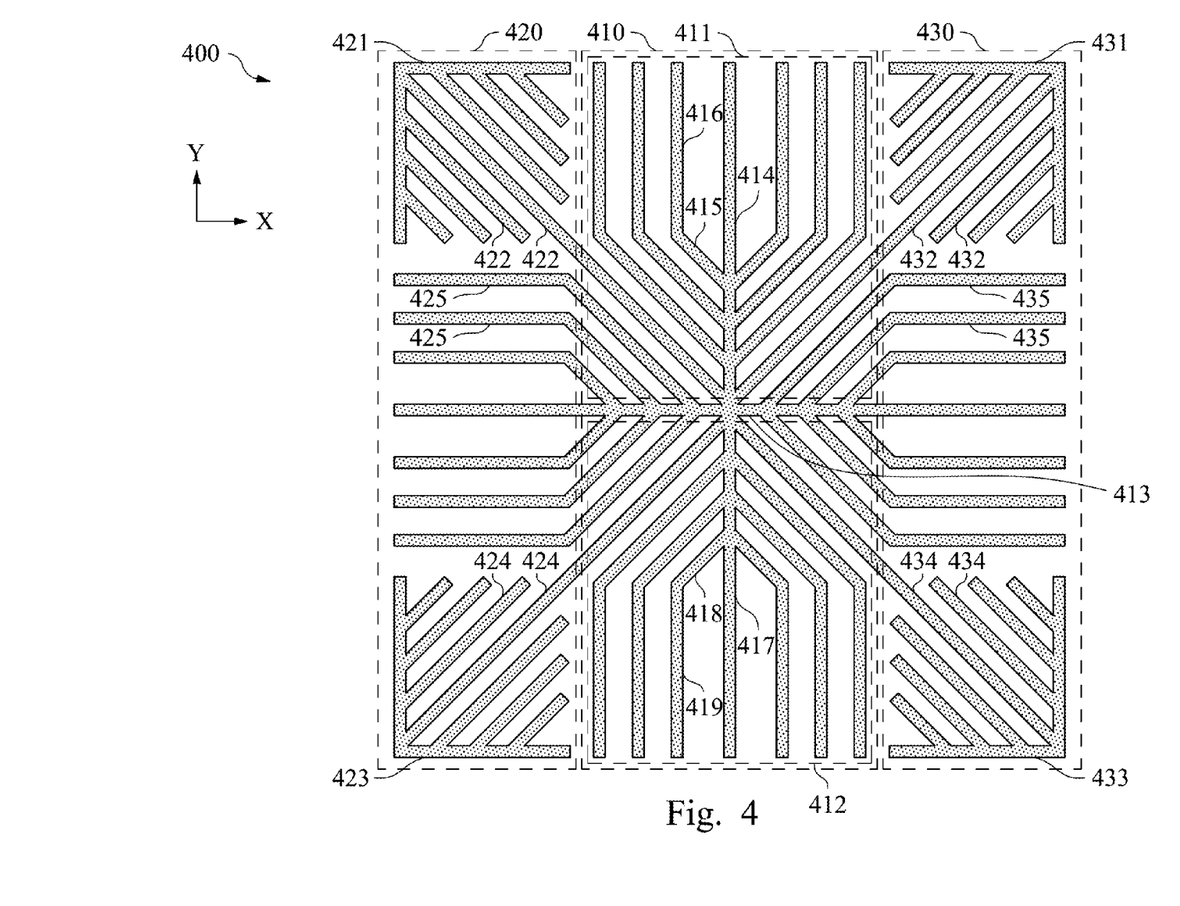
FIG. 4 depicts a schematic diagram of a patterned shield structure according to some embodiments of this disclosure.

FIG. 4 depicts a schematic diagram of a patterned shield structure 400 according to some embodiments of this disclosure. As shown in FIG. 4, a center structure unit 410 comprises a first sub-center structure unit 411, a second sub-center structure unit 412, and a first backbone 413. The first backbone 413 is disposed in a middle of the center structure unit 410. The first sub-center structure unit 411 comprises a second backbone 414, a plurality of first branches 415, and a plurality of second branches 416. The second backbone 414 is coupled to one side (such as an upper side) of the first backbone 413. One end of each of the first branches 415 is coupled to the first backbone 413 or the second backbone 414 and the first branches 415 extend outwardly in a direction away from the first backbone 413 or the second backbone 414. One end of each of the second branches 416 is coupled to another end of one of the first branches 415 correspondingly. In addition, the second sub-center structure unit 412 comprises a third backbone 417, a plurality of third branches 418, and a plurality of fourth branches 419. The third backbone 417 is coupled to another side (such as a lower side) of the first backbone 413. One end of each of the third branches 418 is coupled to the first backbone 413 or the third backbone 417 and the third branches 418 extend outwardly in a direction away from the first backbone 413 or the third backbone 417. One end of each of the fourth branches 419 is coupled to another end of one of the third branches 418 correspondingly.

In one embodiment, an angle between the first branches 415 and the first backbone 413 or the second backbone 414 is an acute angle. An angle between the third branches 418 and the first backbone 413 or the third backbone 417 is an acute angle. The first backbone 413 is disposed in a first direction (such as X direction). The second backbone 414 and the third backbone 417 are disposed in a second direction (such as Y direction) approximately perpendicular to the first direction, and the second branches 416 and the fourth branches 419 are disposed in the second direction.

In another embodiment, a first patterned structure unit 420 comprises a first L-shaped structure 421, a plurality of fifth branches 422, a second L-shaped structure 423, a plurality of sixth branches 424, and a plurality of seventh branches 425. The first L-shaped structure 421 is disposed on one side (such as an upper side) of the first patterned structure unit 420, and an opening of the first L-shaped structure 421 faces a center of the center structure unit 410. One end of each of the fifth branches 422 is coupled to the first L-shaped structure 421 and the fifth branches 422 extend towards the center of the center structure unit 410. Another end of one of the fifth branches 422 is coupled to one of the first branches 415. Additionally, the second L-shaped structure 423 is disposed on another side (such as a lower side) of the first patterned structure unit 420, and an opening of the second L-shaped structure 423 faces the center of the center structure unit 410. One end of each of the sixth branches 424 is coupled to the second L-shaped structure 423 and the sixth branches 424 extend towards the center of the center structure unit 410. Another end of one of the sixth branches 424 is coupled to one of the third branches 418. One end of each of the seventh branches 425 is coupled to the first branch 415, the first backbone 413, or the third branch 418.

In still another embodiment, a second patterned structure unit 430 comprises a third L-shaped structure 431, a plurality of eighth branches 432, a fourth L-shaped structure 433, a plurality of ninth branches 434, and a plurality of tenth branches 435. The third L-shaped structure 431 is disposed on one side (such as an upper side) of the second patterned structure unit 430, and an opening of the third L-shaped structure 431 faces the center of the center structure unit 410. One end of each of the eighth branches 432 is coupled to the third L-shaped structure 431 and the eighth branches 432 extend towards the center of the center structure unit 410. Another end of one of the eighth branches 432 is coupled to one of the first branches 415. Additionally, the fourth L-shaped structure 433 is disposed on another side (such as a lower side) of the second patterned structure unit 430, and an opening of the fourth L-shaped structure 433 faces the center of the center structure unit 410. One end of each of the ninth branches 434 is coupled to the fourth L-shaped structure 433 and the ninth branches 434 extend towards the center of the center structure unit 410. Another end of one of the ninth branches 434 is coupled to one of the third branches 418. One end of each of the tenth branches 435 is coupled to the first branch 415, the first backbone 413, or the third branch 418.

Figure 5:
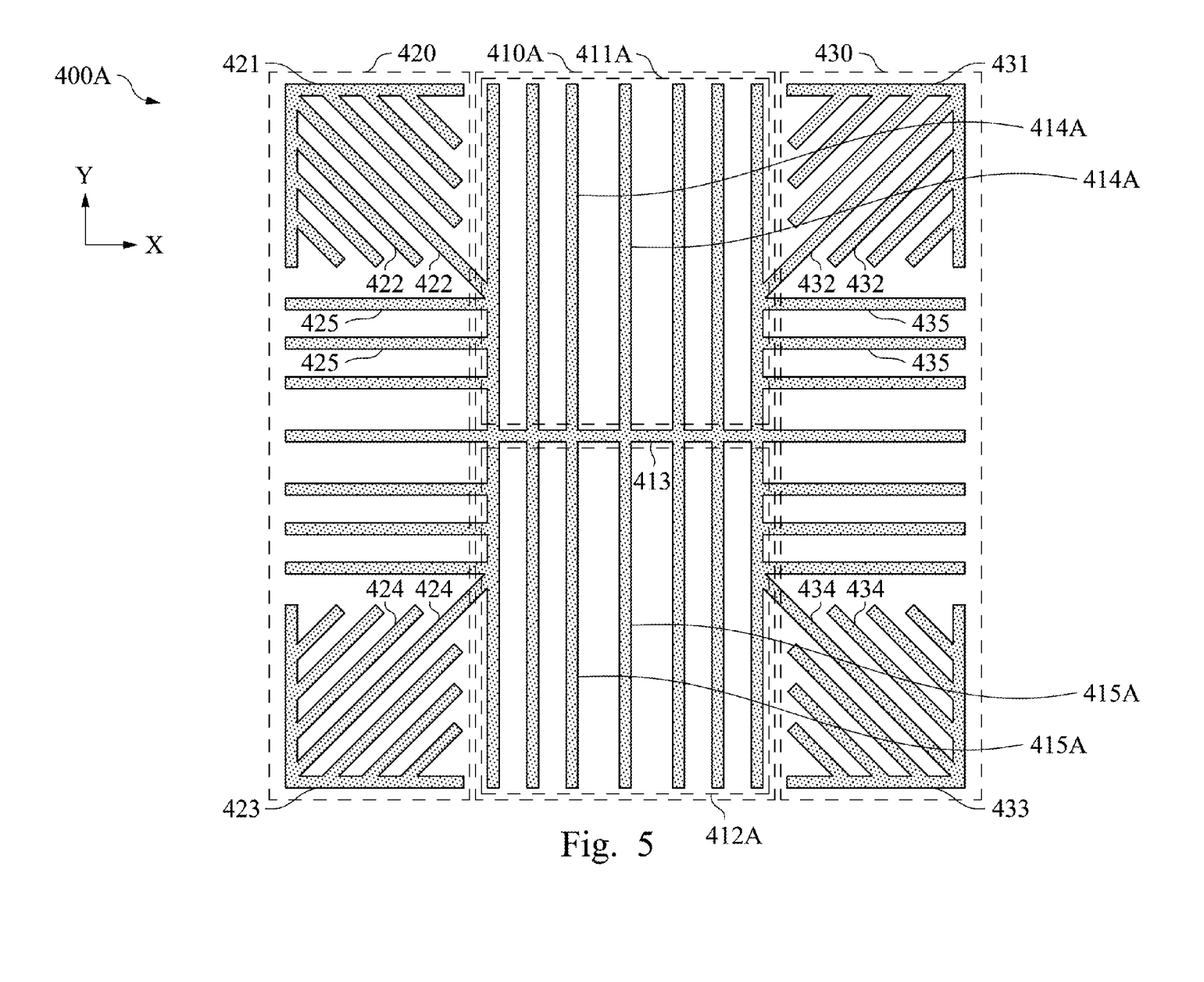
FIG. 5 depicts a schematic diagram of a patterned shield structure according to some embodiments of this disclosure.

FIG. 5 depicts a schematic diagram of a patterned shield structure 400A according to some embodiments of this disclosure. As compared with the center structure unit 410 shown in FIG. 4, a center structure unit 410A in this embodiment is different. A description is provided as follows. The center structure unit 410A comprises the first backbone 413, a first sub-center structure unit 411A, and a second sub-center structure unit 412A. The first backbone 413 is disposed in a middle of the center structure unit 410A. The first sub-center structure unit 411A comprises a plurality of first branches 414A. One end of each of the first branches 414A is coupled to one side (such as an upper side) of the first backbone 413, and the first branches 414A extend outwardly in a direction away from the first backbone 413. The second sub-center structure unit 412A comprises a plurality of second branches 415A. One end of each of the second branches 415A is coupled to another side (such as a lower side) of the first backbone 413, and the second branches 415A extend outwardly in a direction away from the first backbone 413. It is noted that since the patterned structure units 420, 430 in the patterned shield structure 400A shown in FIG. 5 are similar to the patterned structure units 420, 430 in the patterned shield structure 400 shown in FIG. 4, a description in this regard is not provided for simply matters.

Figure 6:
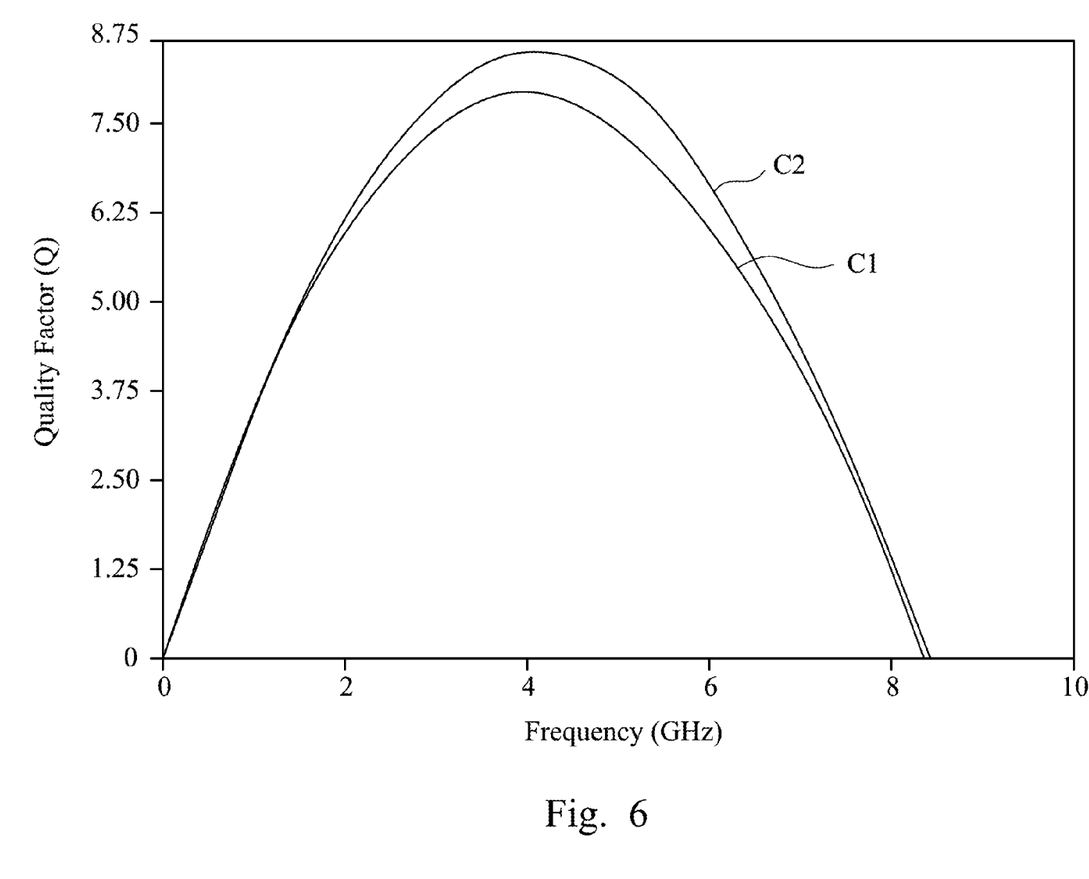
FIG. 6 depicts an experimental data diagram of an inductor of an integrated circuit according to some embodiments of this disclosure.

FIG. 6 depicts an experimental data diagram of an inductor of an integrated circuit according to some embodiments of this disclosure. The experimental data diagram is used for illustrating a quality factor of the inductor of the integrated circuit under different frequencies. As shown in FIG. 6, curve C1 shows verification data of the inductor when the improved patterned shield structure according to the present disclosure is not applied to the integrated circuit. Curve C2 shows verification data of the inductor when the patterned shield structure according to the present disclosure is applied to the integrated circuit. It is thus known from the experimental data shown in FIG. 6 that the quality factor of the inductor of the integrated circuit becomes better if the improved patterned shield structure according to the present disclosure is applied to the integrated circuit. As a result, it can be proved that the patterned shield structure according to the present disclosure can actually improve the quality factor of the inductor of the integrated circuit.

It is therefore understood from the embodiments of the present disclosure that the present disclosure has the following advantages. The present disclosure provides the patterned shield structure, which can be applied to the integrated circuit, so as to improve on the problem that the quality factor of the inductor is decreased.

What is claimed is:

1. A patterned shield structure applied to an integrated circuit, wherein the patterned shield structure is disposed between an inductor and a substrate of the integrated circuit, wherein the patterned shield structure comprises:
   a center structure unit comprising:
      a first backbone disposed in the middle of the center structure unit;
      a first sub-center structure unit; and
      a second sub-center structure unit, the second sub-center structure unit and the first sub-center structure unit being symmetrically disposed with respect to a middle of the center structure unit;
   a first patterned structure unit disposed on one side of the center structure unit, wherein the first patterned structure unit comprises:
      a second backbone disposed in a first direction and located in a middle of the first patterned structure unit;
      a third backbone disposed in a second direction approximately perpendicular to the first direction, and being located on one side of the first patterned structure unit, wherein a connection point of the second backbone and the third backbone is coupled to the first backbone of the center structure unit;
      a plurality of third branches, one end of each of part of the third branches being coupled to one side of the second backbone and the part of the third branches extending outwardly in a direction away from the second backbone, and an angle between the part of the third branches and the second backbone being an acute angle; and
      a plurality of fourth branches, one end of each of part of the fourth branches being coupled to another side of the second backbone and the part of the fourth branches extending outwardly in a direction away from the second backbone, and an angle between the part of the fourth branches and the second backbone being an acute angle; and
   a second patterned structure unit disposed on another side of the center structure unit, and the second patterned structure unit and the first patterned structure unit being symmetrically disposed with respect to the center structure unit.

2. The patterned shield structure of claim 1, wherein the first sub-center structure unit comprises:
   a plurality of first branches, one end of each of the first branches being coupled to one side of the first backbone, and the first branches extending outwardly in a direction away from the first backbone;
wherein the second sub-center structure unit comprises:
   a plurality of second branches, one end of each of the second branches being coupled to another side of the first backbone, and the second branches extending outwardly in a direction away from the first backbone.

3. The patterned shield structure of claim 1, wherein one end of each of part of the third branches is coupled to the third backbone and the part of the third branches extend outwardly in a direction away from the third backbone, and an angle between the part of the third branches and the third backbone is an acute angle, wherein one end of each of part of the fourth branches is coupled to the third backbone and the part of the fourth branches extend outwardly in a direction away from the third backbone, and an angle between the part of the fourth branches and the third backbone is an acute angle.

4. The patterned shield structure of claim 1, wherein the first sub-center structure unit comprises:
   a plurality of first strip portions disposed in a first direction; and
   a second strip portion disposed in a second direction approximately perpendicular to the first direction, and the second strip portion being coupled to one end of each of the first strip portions;
wherein the second sub-center structure unit comprises
   a plurality of third strip portions disposed in the first direction; and
   a fourth strip portion disposed in the second direction, and the fourth strip portion being coupled to one end of each of the third strip portions.

5. The patterned shield structure of claim 4, wherein each of the first strip portions is coupled to one of the third strip portions correspondingly.

6. The patterned shield structure of claim 4, wherein each of the first patterned structure unit and the second patterned structure unit comprises a fishbone structure.

7. The patterned shield structure of claim 1, wherein the first sub-center structure unit comprises:
   a second backbone coupled to one side of the first backbone;
   a plurality of first branches, one end of each of the first branches being coupled to the first backbone or the second backbone, and the first branches extending outwardly in a direction away from the first backbone or the second backbone; and
   a plurality of second branches, one end of each of the second branches being coupled to another end of one of the first branches correspondingly;
wherein the second sub-center structure unit comprises:
   a third backbone coupled to another side of the first backbone;
   a plurality of third branches, one end of each of the third branches being coupled to the first backbone or the third backbone, and the third branches extending outwardly in a direction away from the first backbone or the third backbone; and
   a plurality of fourth branches, one end of each of the fourth branches being coupled to another end of one of the third branches correspondingly.

8. The patterned shield structure of claim 7, wherein an angle between the first branches and the first backbone or the second backbone is an acute angle, wherein an angle between the third branches and the first backbone or the third backbone is an acute angle, wherein the first backbone is disposed in a first direction, the second backbone and the third backbone are disposed in a second direction approximately perpendicular to the first direction, wherein the second branches and the fourth branches are disposed in the second direction.

9. The patterned shield structure of claim 1, wherein the first sub-center structure unit comprises:
   a plurality of first branches, one end of each of the first branches being coupled to one side of the first backbone, and the first branches extending outwardly in a direction away from the first backbone;
wherein the second sub-center structure unit comprises:
   a plurality of second branches, one end of each of the second branches being coupled to another side of the first backbone, and the second branches extending outwardly in a direction away from the first backbone.

\* \* \* \* \*